United States Patent
Chou et al.

(10) Patent No.: US 6,710,461 B2
(45) Date of Patent: Mar. 23, 2004

(54) WAFER LEVEL PACKAGING OF MICRO ELECTROMECHANICAL DEVICE

(75) Inventors: Bruce C. S. Chou, Hsinchu (TW); Hsien-Ming Wu, Taoyuan Hsien (TW); Ping-Chin Sun, Taipei Hsien (TW)

(73) Assignee: Lightuning Tech. Inc., Hsinchu (TW)

( * ) Notice: Subject to any disclaimer, the term of this patent is extended or adjusted under 35 U.S.C. 154(b) by 65 days.

(21) Appl. No.: 10/162,905

(22) Filed: Jun. 6, 2002

(65) Prior Publication Data

US 2003/0227094 A1 Dec. 11, 2003

(51) Int. Cl.$^7$ ............................................... H01L 23/48
(52) U.S. Cl. ........................ 257/780; 257/778; 257/779; 257/774; 438/108
(58) Field of Search ...................... 257/780, 778–779, 257/774; 438/108

(56) References Cited

U.S. PATENT DOCUMENTS 6,342,406 B1 * 1/2002 Glenn et al. ................. 438/57

* cited by examiner

Primary Examiner—Kamand Cuneo
Assistant Examiner—Luan Thai
(74) Attorney, Agent, or Firm—Rosenberg, Klein & Lee

(57) ABSTRACT

The present invention provides a wafer level package of micro electromechanical devices. The wafer level package of the present invention comprises a wafer having a plurality of micro electromechanical devices and a package wafer of the same size. A plurality of conductor plugs penetrate through the upper and lower surfaces of the package wafer. Solder bumps are formed on the conductor plugs to be adhered to predetermined solder bumps on the micro electromechanical device wafer so as to form a package device. The wafer level package of the present invention can prevent micro electromechanical devices from damage during the packaging procedure.

13 Claims, 6 Drawing Sheets

WAFER LEVEL PACKAGING OF MICRO ELECTROMECHANICAL DEVICE

FIELD OF THE INVENTION

The present invention relates to a wafer level package technique and, more particularly, to a wafer level package structure of micro electromechanical devices.

BACKGROUND OF THE INVENTION

In the semiconductor industry, the micro-machining technology is a newly developing technique. It exploits the integrated-circuit (IC) technology to fabricate various kinds of micro-sensors and micro-drivers. Additionally, the micro-machining technology integrated with micro-electronic circuits can constitute micro-systems, which is called micro electromechanical system (MEMS).

Different from the conventional IC fabrication technology, the fabrication technology relevant to micro electromechanical devices is very broad and complex. However, most micro electromechanical devices make use of the micro-machining technology to fabricate suspended structures having only a few supporting points so as to enhance mechanical sensitivity thereof (e.g., pressure sensors), or to reduce thermal conductance thereof (e.g., thermal sensors). In the conventional fabrication process of IC devices, after IC devices are fabricated on a wafer, the wafer is diced into a plurality of single chips, which then undergo the procedures of wire bonding and compound molding for packaging.

In consideration of cost, the MEMS industry will be benefited if the IC fabrication process can apply to the production of micro electromechanical devices. However, some difficulties must be overcome. First, the flushing of cooling water during the dicing procedure and the small powders resulted from dicing will damage suspended devices so that the yield will be reduced. Secondly, micro electromechanical devices will be fixed during the procedure of compound molding so that the object of enhancing their sensitivity by suspended structures will be lost.

Accordingly, the present invention aims to propose a package structure applicable to micro electromechanical devices so as to avoid damage in the above packaging procedure.

SUMMARY AND OBJECTS OF THE PRESENT INVENTION

The primary object of the present invention is to propose a wafer level package of micro electromechanical devices so that damage of the micro electromechanical devices due to external forces in the packaging procedure can be avoided.

Another object of the present invention is to use a silicon wafer as a package base so that the whole package device not only has good evenness and keeps good contact with a chip, but also has better thermal conductance. Packaged modules will thus have good heat-radiating effect.

According to an embodiment of the present invention, a wafer having a plurality of micro electromechanical devices and a package wafer base of the same size are installed together. Conductor plugs between the upper and lower surfaces of the package wafer are exploited to conduct the upper and lower surfaces of the package wafer. Solder bumps are then disposed at two ends of the conductor plugs. The solder bumps are installed on predetermined solder bumps on the micro electromechanical device wafer. Electric connection can thus be achieved between the micro electromechanical device wafer and the package wafer.

Besides, according to another embodiment of the present invention, a plurality of micro electromechanical devices are fabricated on a package wafer base, which is then installed with a substrate of the same size. Conductor plugs between the upper and lower surfaces of the package wafer are exploited to conduct the upper and lower surfaces of the package wafer. Next, solder bumps are disposed at two ends of the conductor plugs. The solder bumps are then installed on predetermined solder bumps on the substrate.

The various objects and advantages of the present invention will be more readily understood from the following detailed description when read in conjunction with the appended drawings, in which:

BRIEF DESCRIPTION OF DRAWING

FIG. 2 is a partly enlarged cross-sectional view of the present invention before packaging, wherein FIG. 2(a) is a partly enlarged photograph of a conductor plug formed in a through hole;

DETAILED DESCRIPTION OF PREFERRED EMBODIMENT

The present invention is characterized in that conductor plugs and bonding solders of a package wafer base are exploited to electrically connect I/O bonding pads of micro electromechanical devices to the exposed surface of the package wafer base. The other surface of the package wafer base is glued with the micro electromechanical device wafer to form a wafer level package, which is then diced into a plurality of single chip modules.

Figure 1:
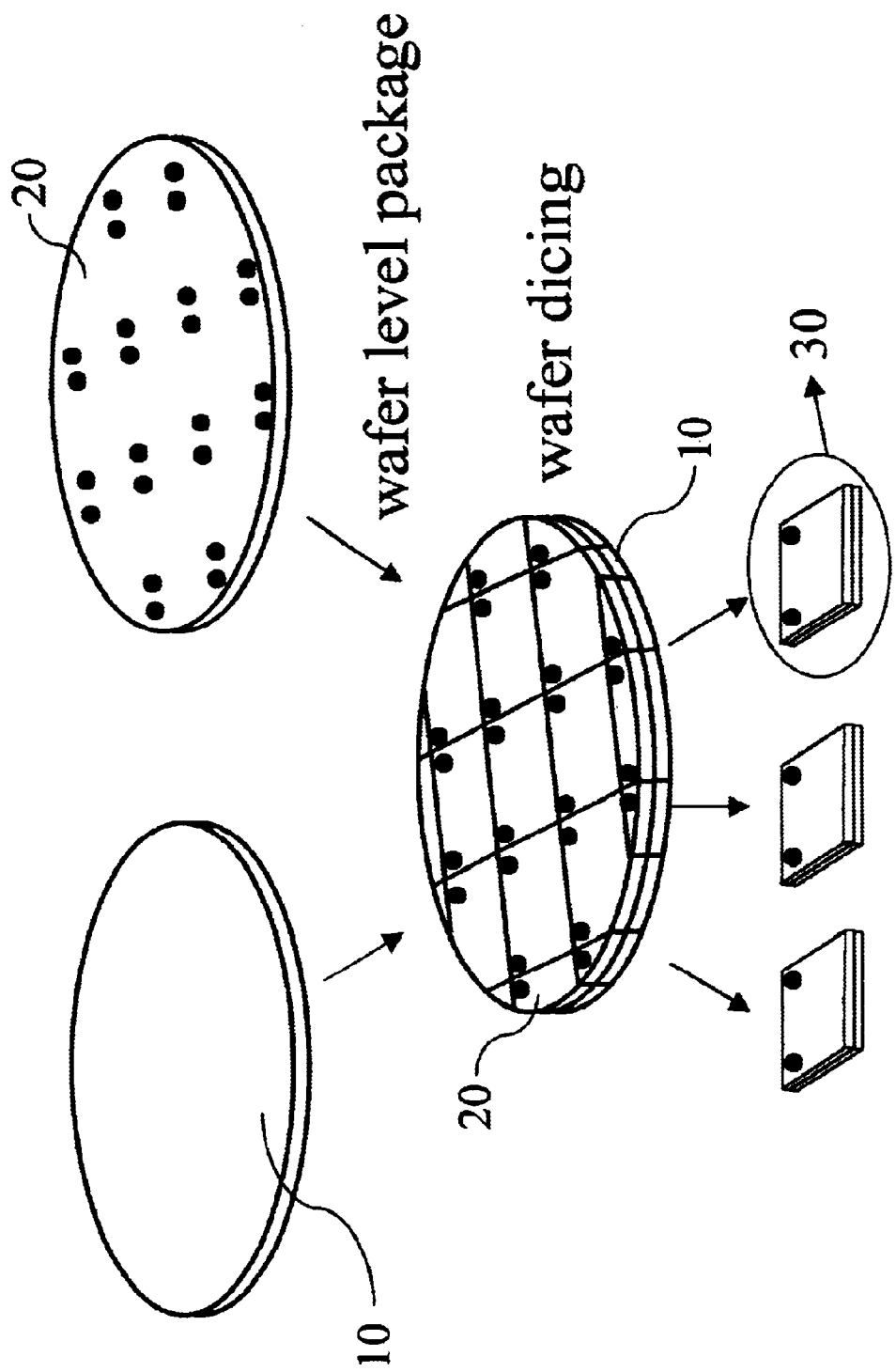
FIG. 1 is a diagram of the packaging process of the present invention.

As shown in FIG. 1, a micro electromechanical device wafer 10 and a package silicon wafer 20 of the same size are glued with solders and are then diced into a plurality of single chip modules 30. The utmost advantage of this method is that damage to micro electromechanical devices due to external forces during the packaging procedure can be avoided. Moreover, better evenness can be obtained by using a silicon wafer as a package base as compared to other materials. Also, thermal expansion coefficients of the two wafers can be considered to be the same so as to cause less thermal residual stress during the packaging procedure than that of other package materials like glass, ceramic, and printed circuit board. Additionally, because silicon material has good thermal conductance, the packaged modules will have good heat-radiating effect.

Figures 2, 2A:
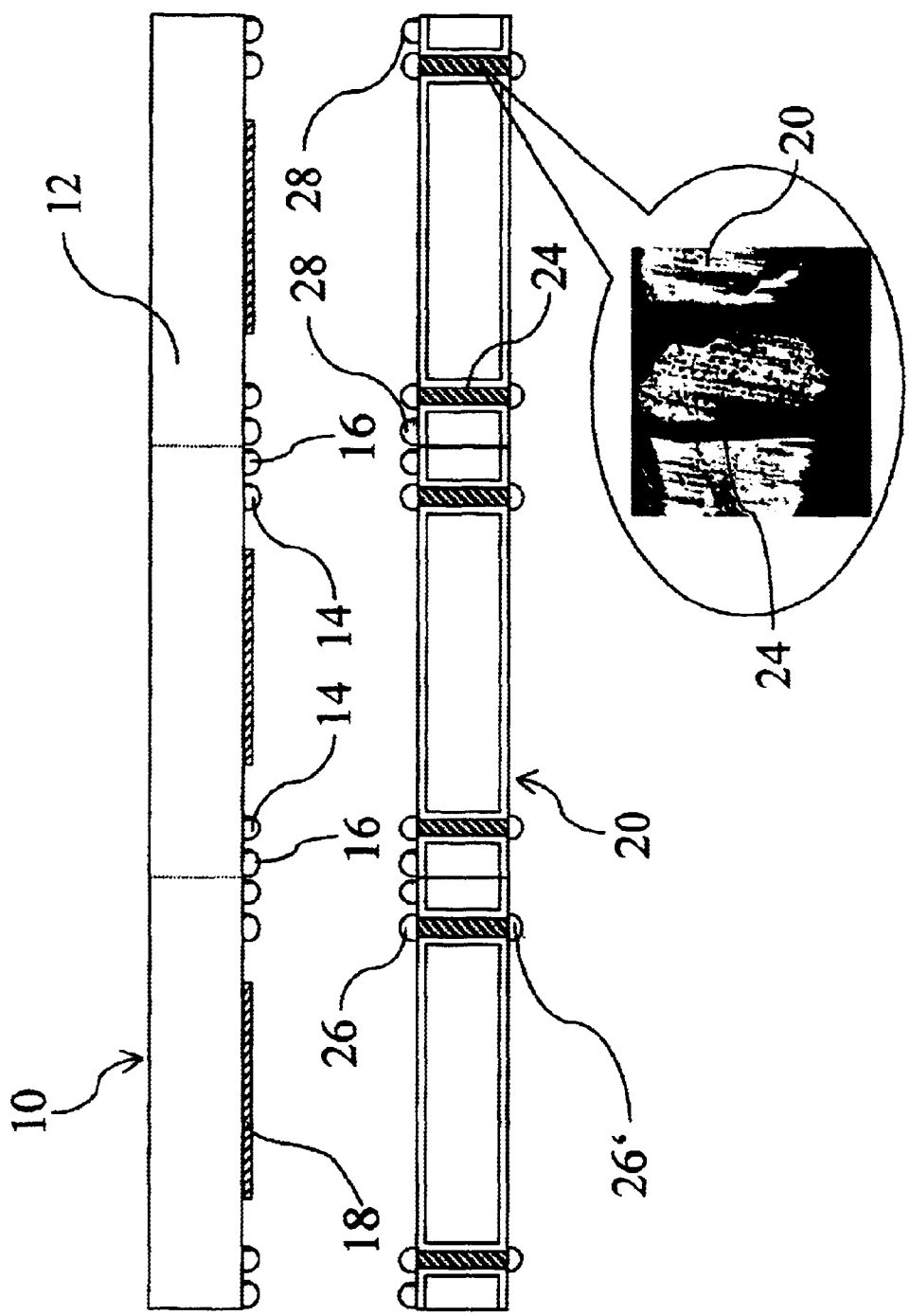

As shown in FIG. 2, the upper layer is the micro electromechanical device silicon wafer 10. A plurality of micro electromechanical devices 18 are fabricated therein. Here, the device's type is not limited. The micro electromechanical device silicon wafer 10 is formed by arranging many chip units 12. A plurality of first solder bumps 14 corresponding to I/O bonding pads of the chip units 12 are disposed on the surface of the wafer 10. Ring-shaped solder bumps are disposed at the outer periphery on the surface of the micro electromechanical device silicon wafer 10 to form a first guard ring 16. The guard ring 16 encloses and protects the whole internal micro electromechanical devices 18. The package silicon wafer 20 as a package base has the same size as the micro electromechanical device silicon wafer 10. A plurality of conductor plugs 24 penetrate through the package silicon wafer 20. As shown in FIG. 2(a), the nickel conductor plugs 24 are formed in through holes of the package silicon wafer 20. A plurality of second solder bumps 26 and 26' are then disposed at two ends of the conductor plugs 24. Ring-shaped solder bumps used as a second guard ring 28 are disposed at the outer peripheral on the surface of the package silicon wafer 20. The positions of the second solder bumps 26 and 26' and the second guard ring 28 correspond to those of the first solder bumps 14 and the first guard ring 16 on the micro electromechanical device silicon wafer 10.

Figure 3:
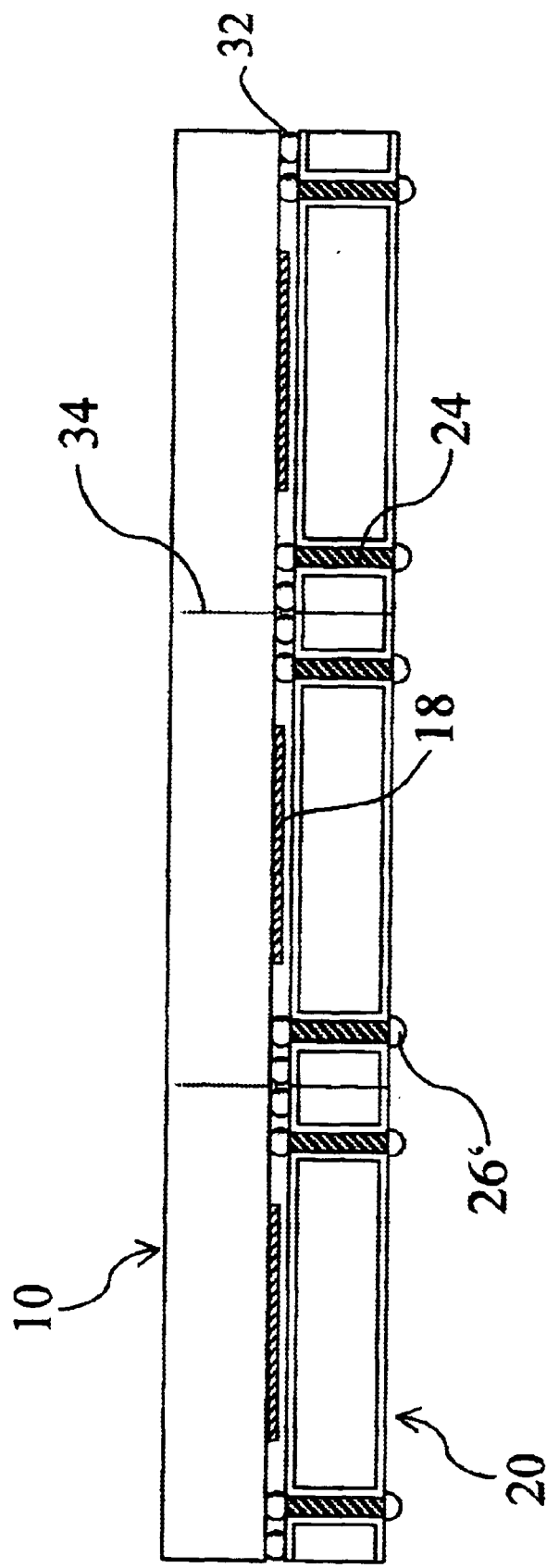
FIG. 3 is a partly enlarged cross-sectional view of the present invention after packaging.
Figure 4:
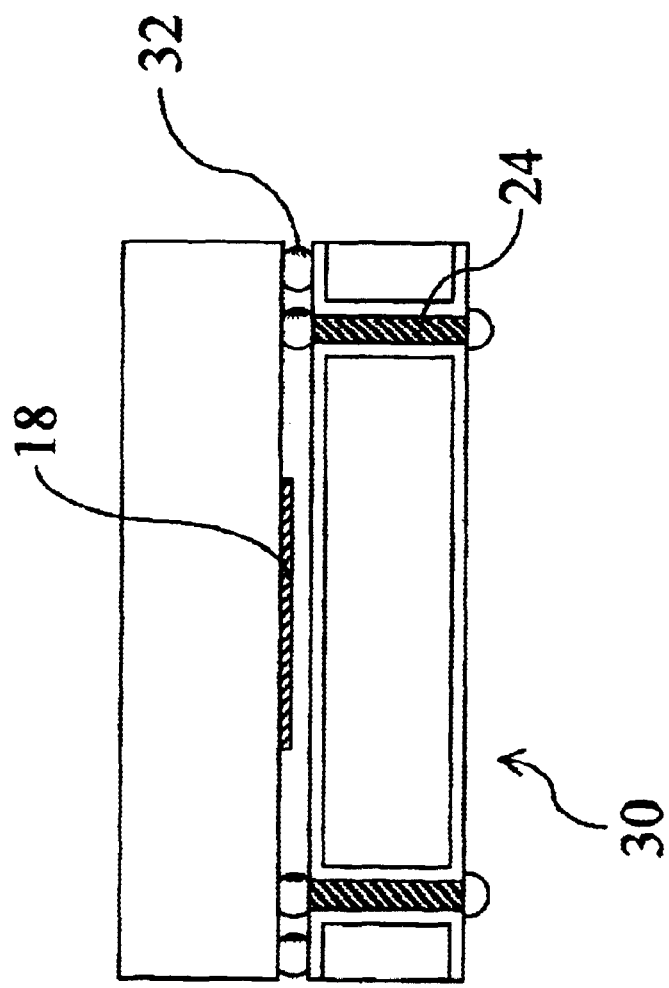
FIG. 4 is a cross-sectional view of a sliced single chip module of the present invention.

Wafer level package of the micro electromechanical device silicon wafer 10 and the package silicon wafer 20 is achieved by soldering the first solder bumps 14 and the first guard ring 16 with the second solder bumps 26 and the second guard ring 28 to form a plurality of solder points 32, as shown in FIG. 3. Space formed by the solder points 32 and the package silicon wafer 20 is used to receive and cover the corresponding micro electromechanical devices 18. The adhering process is described as follows. After the fabrication of the solder bumps 14 and 26, the micro electromechanical device silicon wafer 10 and the package silicon wafer 20 are aligned with a double side aligner (e.g., Electronic Vision EV-620). It is then fixed with a clamp. The fixed module is subsequently moved to a bonding machine (e.g., Electronic Vision EV-560) for proceeding the heating, pressure loading, and welding steps to complete the solder bonding procedure. Finally, the packaged wafer level package structure is diced into a plurality of single chip modules 30 through predefined dicing paths 34, as shown in FIG. 4.

The technique of forming a plurality of conductor plugs 24 penetrating through the package silicon wafer 20 will be illustrated below. The technique of fabricating the first solder bumps 14 on the bonding pads of the micro electromechanical device silicon wafer 10 is a well known IC packaging technique and thus will not be further described.

Furthermore, airtight and even vacuum package can be provided according to the kinds and requirement of the micro electromechanical devices 18 by means of adhering procedure of the guard rings 16 and 28 formed on the two silicon wafers 10 and 20. Therefore, the present invention can provide a wafer level package technique applicable to micro electromechanical devices.

The above conductor plugs 24 are formed of nickel, copper, or gold by using the chemical or electrochemical vapor deposition method. Additionally, low-melting-point metal like In, In/Sb alloy, Sb, or Sb/Pb alloy can be injected into a plurality of through holes by using a hot embossing method. In this method, a predetermined quantity of low-melting-point metal is placed on the top surface of the package silicon wafer having the through holes to form an assembly, and this assembly is then placed into a sealed mold. When the mold is heated to the melting-point of that metal, an upper pressing plate of the mold is pressurized or the bottom of the mold is vacuumed to inject the metal conductor into the through holes. The method of forming the through holes between two faces of the silicon wafer is described below. A plurality of trenches having vertical sidewalls are etched through the silicon wafer 20 by using inductively-coupled plasma reactive ion etching (ICP RIE, e.g., Alcatel 601E). The etching gas used in the ICP RIE is mainly $SF_6$ so that the depth/width aspect ratio of the trench can be larger than 30, and the etching rate of silicon material can achieve 10 $\mu$m/min. For instance, the thickness of a 6-inch silicon wafer is about 670 $\mu$m. Therefore, the minimal size of width of the trench can be smaller than 25 $\mu$m, and the pitch size can be smaller than 50 $\mu$m.

Figure 5:
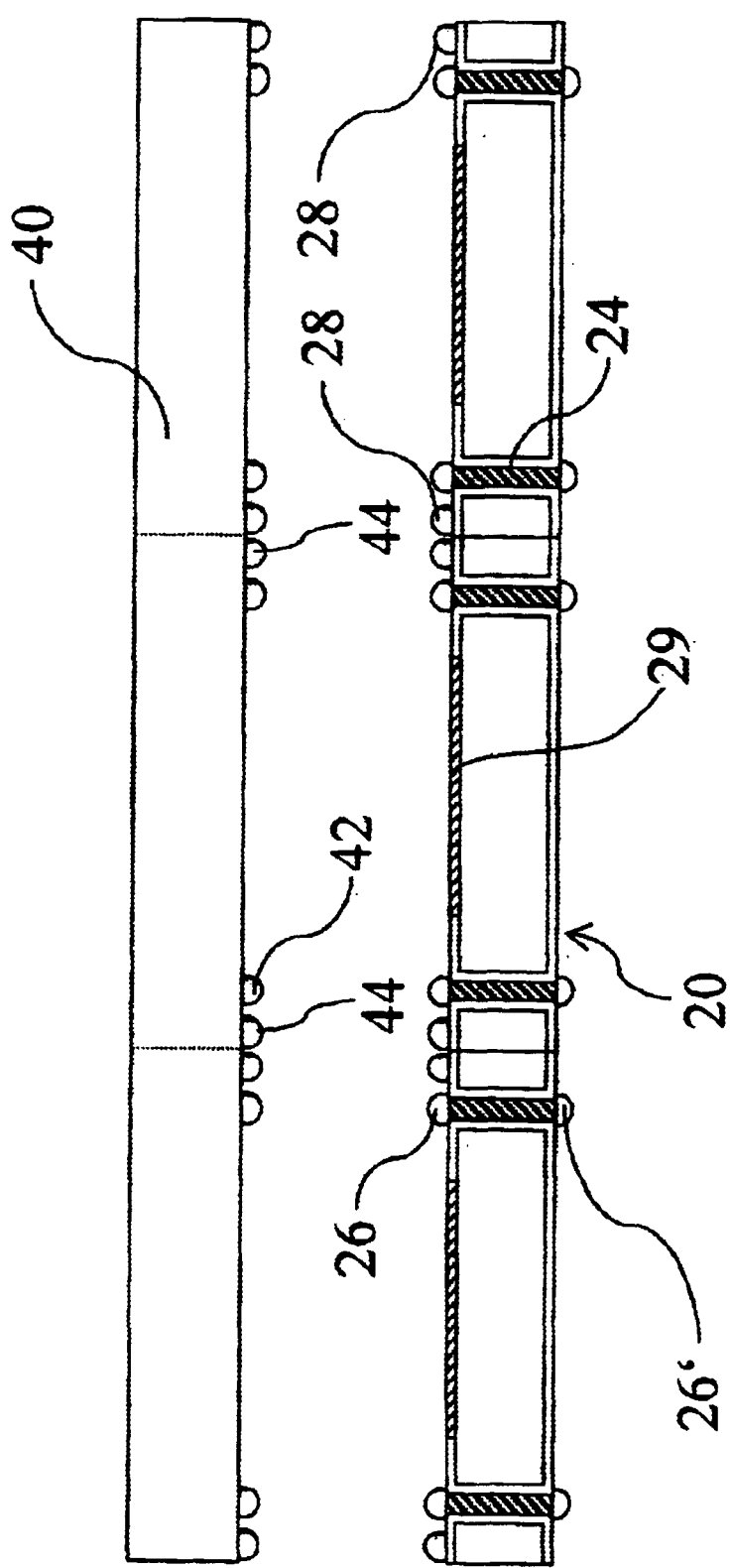
FIG. 5 is a partly enlarged cross-sectional view according to another embodiment of the present invention before packaging.
Figure 6:
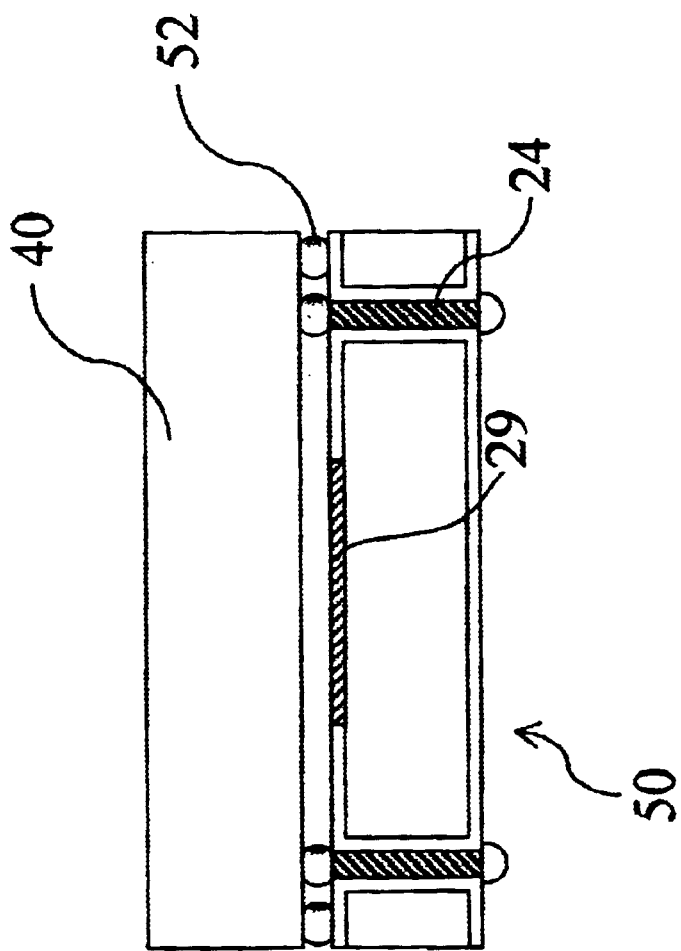
FIG. 6 is a cross-sectional view of a sliced single chip module according to another embodiment of the present invention.

As shown in FIG. 5, the micro electromechanical devices can be directly fabricated on the surface of the package silicon wafer 20. A plurality of micro electromechanical devices 29 are directly fabricated inside the package silicon wafer 20. Here, the device's type is not limited. A plurality of conductor plugs 24 penetrate through the upper and lower surfaces of the package silicon wafer 20. A plurality of second solder bumps 26 and 26' are formed at two ends of the conductor plugs 24. A second guard ring 28 is disposed at the periphery of the micro electromechanical devices 29. A substrate 40 is also provided. A plurality of solder bumps 42 corresponding to I/O bonding pads of chip units are disposed on the surface of the substrate 40. A guard ring 44 is formed at the outer periphery of the solder bumps 42. The positions of the solder bumps 42 and the guard ring 44 correspond to those of second solder bumps 26 and the second guard ring 28 on the package silicon wafer 20 to cover the corresponding micro electromechanical devices 29. The substrate 40 is installed on the package silicon wafer 20 by soldering the solder bumps 42 and the guard ring 44 with the second solder bumps 26 and the second guard ring 28 to form a plurality of solder points 52. Finally, the packaged wafer level package structure is diced into a plurality of single chip modules 50 through predefined dicing paths, as shown in FIG. 6.

The substrate 40 can be a transparent substrate, a glass substrate, a ceramic substrate, a silicon wafer substrate, or a substrate having ICs therein.

To sum up, the present invention discloses a wafer level package of micro electromechanical devices so that damage of the micro electromechanical devices due to external forces in the packaging procedure can be avoided. Moreover, the whole package device not only has good evenness and keeps good contact with a chip, but also has better thermal conductance. Packaged modules will thus have good heat-radiating effect.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A wafer level package of micro electromechanical devices, comprising:

a micro electromechanical device wafer with a plurality of micro electromechanical devices fabricated therein, said micro electromechanical device wafer being formed by arranging many chip units, a plurality of first solder bumps corresponding to I/O bonding pads of said chip units being disposed on a surface of said wafer, a guard ring of said first solder bumps being disposed at an outer periphery of each of said chip units to enclose the whole internal micro electromechanical devices and the I/O bonding pads; and a package wafer base of the same size as that of said micro electromechanical device wafer, a plurality of conductor plugs penetrating through upper and lower surfaces of said package wafer base, second solder bumps being disposed at two ends of said conductor plugs, a guard ring of said second solder bumps being fabricated on the upper surface of said package wafer base, said micro electromechanical device wafer being installed on said package wafer base by soldering said first solder bumps and said first guard ring with said second solder bumps and said second guard ring.

2. The wafer level package of micro electromechanical devices as claimed in claim 1, wherein the material of said micro electromechanical device wafer and said package wafer base is silicon.

3. The wafer level package of micro electromechanical devices as claimed in claim 1, wherein said conductor plugs are formed of nickel, copper, or gold by using the chemical or electrochemical vapor deposition method.

4. The wafer level package of micro electromechanical devices as claimed in claim 1, wherein said conductor plugs are formed by injecting low-melting-point metal into a plurality of through holes by means of a hot embossing method.

5. The wafer level package of micro electromechanical devices as claimed in claim 4, wherein said low-melting-point metal is In, In/Sb alloy, Sb, or Sb/Pb alloy.

6. The wafer level package of micro electromechanical devices as claimed in claim 4, wherein said hot embossing method comprises the following steps: placing a predetermined quantity of low-melting-point metal on said package silicon wafer having said through holes to form an assembly; placing the assembly into a sealed mold; heating the mold plate to the melting-point of that metal; and pressurizing an upper pressing plate of the mold or vacuuming the bottom of the mold to inject the metal into said through holes.

7. A wafer level package of micro electromechanical devices, comprising:

a substrate formed by arranging many chip units, a plurality of first solder bumps being disposed on a surface of said substrate, a guard ring of said first solder bumps being disposed at an outer periphery of each of said chip units; and a package wafer base of the same size as that of said substrate, said package wafer base having a plurality of micro electromechanical devices fabricated therein, a plurality of conductor plugs penetrating through upper and lower surfaces of said package wafer base, second solder bumps being disposed at two ends of said conductor plugs, a guard ring of said second solder bumps being fabricated on the upper surface of said package wafer base, said substrate being installed on said package wafer base by soldering said first solder bumps and said first guard ring with said second solder bumps and said second guard ring.

8. The wafer level package of micro electromechanical devices as claimed in claim 7, wherein said substrate is a transparent substrate, a glass substrate, a ceramic substrate, a silicon substrate, or a substrate having ICs therein.

9. The wafer level package of micro electromechanical devices as claimed in claim 7, wherein the material of said package wafer base is silicon.

10. The wafer level package of micro electromechanical devices as claimed in claim 7, wherein said conductor plugs are formed of nickel, copper, or gold by using the chemical or electrochemical vapor deposition method.

11. The wafer level package of micro electromechanical devices as claimed in claim 7, wherein said conductor plugs are formed by injecting low-melting-point metal into a plurality of through holes by means of a hot embossing method.

12. The wafer level package of micro electromechanical devices as claimed in claim 11, wherein said low-melting-point metal is In, In/Sb alloy, Sb, or Sb/Pb alloy.

13. The wafer level package of micro electromechanical devices as claimed in claim 11, wherein said hot embossing method comprises the following steps: placing a predetermined quantity of low-melting-point metal on said package silicon wafer base having said through holes to form an assembly; placing the assembly into a sealed mold; heating the mold plate to the melting-point of that metal; and pressurizing an upper pressing plate of the mold or vacuuming the bottom of the mold to inject the metal into said through holes.

* * * * *